US011164740B2

(12) United States Patent
Hurwitz et al.

(10) Patent No.: US 11,164,740 B2
(45) Date of Patent: Nov. 2, 2021

(54) SEMICONDUCTOR STRUCTURE HAVING POROUS SEMICONDUCTOR LAYER FOR RF DEVICES

(71) Applicant: Newport Fab, LLC, Newport Beach, CA (US)

(72) Inventors: Paul D. Hurwitz, Irvine, CA (US); Edward Preisler, San Clemente, CA (US); David J. Howard, Irvine, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/597,779

(22) Filed: Oct. 9, 2019

(65) Prior Publication Data

US 2021/0111019 A1 Apr. 15, 2021

(51) Int. Cl.
*H01L 21/02* (2006.01)
*H01L 29/04* (2006.01)
*H01L 29/08* (2006.01)
*H01L 23/66* (2006.01)
*H03K 17/687* (2006.01)
*H01L 21/762* (2006.01)

(52) U.S. Cl.
CPC .. *H01L 21/02203* (2013.01); *H01L 21/76294* (2013.01); *H01L 23/66* (2013.01); *H01L 29/04* (2013.01); *H01L 29/0843* (2013.01); *H03K 17/687* (2013.01); *H01L 2223/6677* (2013.01)

(58) Field of Classification Search
CPC ......... H01L 21/02203; H01L 21/76294; H01L 29/04; H01L 29/0843; H01L 23/66; H01L 17/687; H01L 27/687; H01L 2223/6677; H01L 21/02; H01L 29/08; H01L 21/762; H03K 17/687
USPC ........................................................ 257/728
See application file for complete search history.

(56) References Cited

U.S. PATENT DOCUMENTS

| | | | |
|---|---|---|---|
| 6,376,285 B1 * | 4/2002 | Joyner | H01L 21/3167 438/149 |
| 7,420,201 B2 * | 9/2008 | Langdo | H01L 21/28518 257/18 |
| 7,777,250 B2 | 8/2010 | Lochtefeld | |
| 9,385,023 B1 * | 7/2016 | Cheng | H01L 29/7855 |
| 10,643,927 B1 | 5/2020 | Shank et al. | |
| 2002/0175378 A1 | 11/2002 | Choe et al. | |
| 2004/0108552 A1 | 6/2004 | Azuma et al. | |
| 2004/0132267 A1 | 7/2004 | Sadana et al. | |
| 2007/0108513 A1 * | 5/2007 | Rub | H01L 29/7804 257/329 |

(Continued)

*Primary Examiner* — Alexander O Williams
(74) *Attorney, Agent, or Firm* — Farjami & Farjami LLP

(57) ABSTRACT

A semiconductor structure includes a substrate having a first dielectric constant, a porous semiconductor layer situated over the substrate, and a crystalline epitaxial layer situated over the porous semiconductor layer. A first semiconductor device is situated in the crystalline epitaxial layer. The porous semiconductor layer has a second dielectric constant that is substantially less than the first dielectric constant such that the porous semiconductor layer reduces signal leakage from the first semiconductor device. The semiconductor structure can include a second semiconductor device situated in the crystalline epitaxial layer, and an electrical isolation region separating the first and second semiconductor devices.

20 Claims, 8 Drawing Sheets

(56) References Cited

U.S. PATENT DOCUMENTS

| | | | |
|---|---|---|---|
| 2008/0034335 A1* | 2/2008 | Cheng | H01L 29/66772 |
| | | | 257/506 |
| 2009/0212341 A1* | 8/2009 | Cheng | H01L 27/10802 |
| | | | 257/316 |
| 2010/0203711 A1 | 8/2010 | Wang et al. | |
| 2013/0167915 A1 | 7/2013 | Moslehi et al. | |
| 2013/0171767 A1 | 7/2013 | Moslehi et al. | |
| 2013/0249047 A1 | 9/2013 | Hung et al. | |
| 2013/0279137 A1 | 10/2013 | Gardner et al. | |
| 2013/0288418 A1 | 10/2013 | Wang et al. | |
| 2014/0061757 A1* | 3/2014 | Kim | H01L 29/66833 |
| | | | 257/316 |
| 2014/0264630 A1 | 9/2014 | Huang et al. | |
| 2015/0021698 A1* | 1/2015 | Ando | H01L 27/0886 |
| | | | 257/368 |
| 2015/0137388 A1 | 5/2015 | Kim et al. | |
| 2015/0262911 A1 | 9/2015 | Chen et al. | |
| 2016/0336428 A1* | 11/2016 | Cheng | H01L 29/167 |
| 2018/0166475 A1 | 6/2018 | Chen et al. | |
| 2018/0226471 A1 | 8/2018 | Hille et al. | |
| 2018/0277632 A1 | 9/2018 | Fanelli et al. | |
| 2018/0337211 A1 | 11/2018 | Su et al. | |
| 2019/0002275 A1 | 1/2019 | Chang et al. | |
| 2019/0148570 A1* | 5/2019 | Wu | H01L 27/1462 |
| | | | 257/187 |
| 2020/0212492 A1 | 7/2020 | Collins et al. | |
| 2020/0335826 A1 | 10/2020 | Collins et al. | |

\* cited by examiner

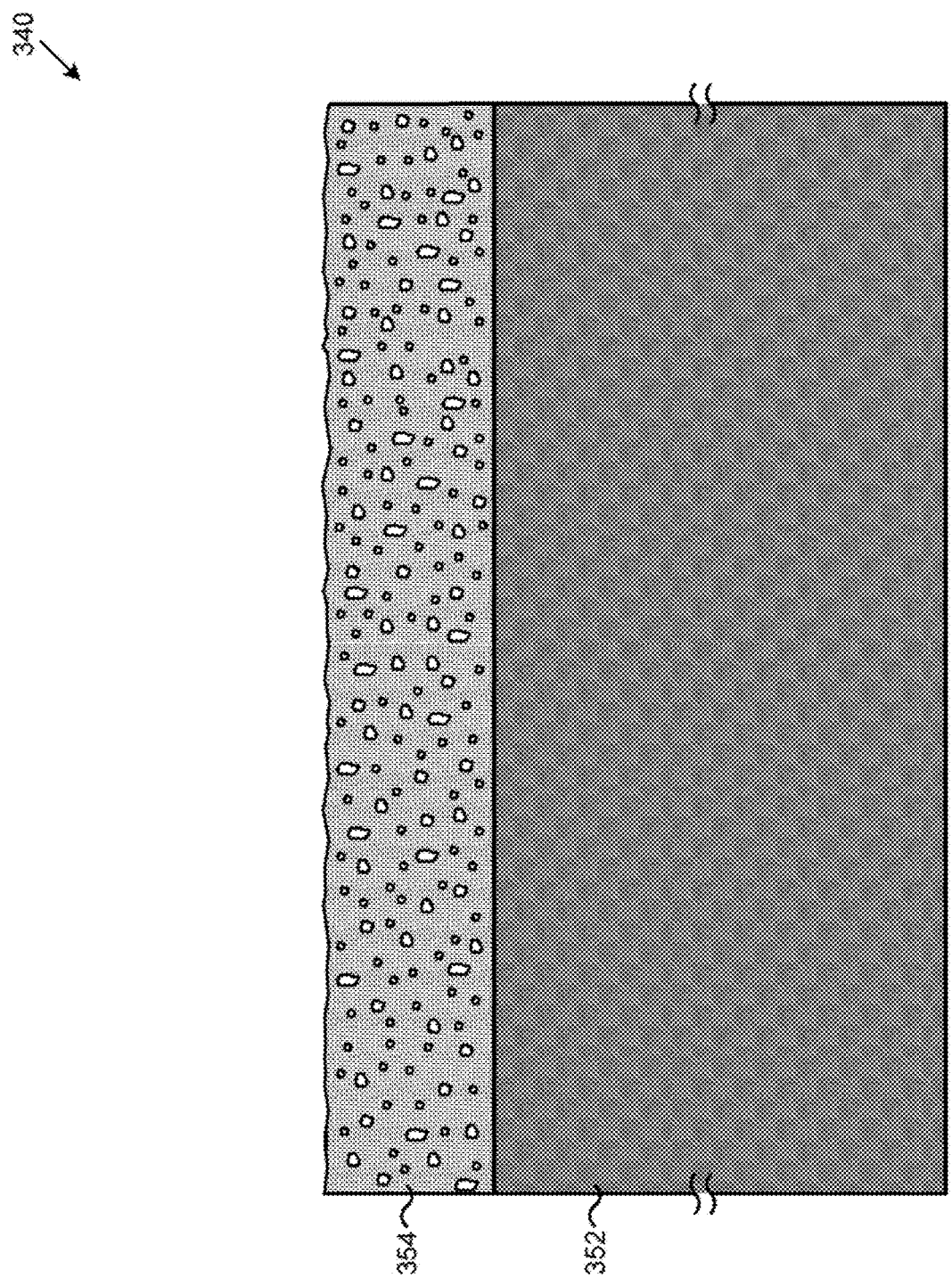

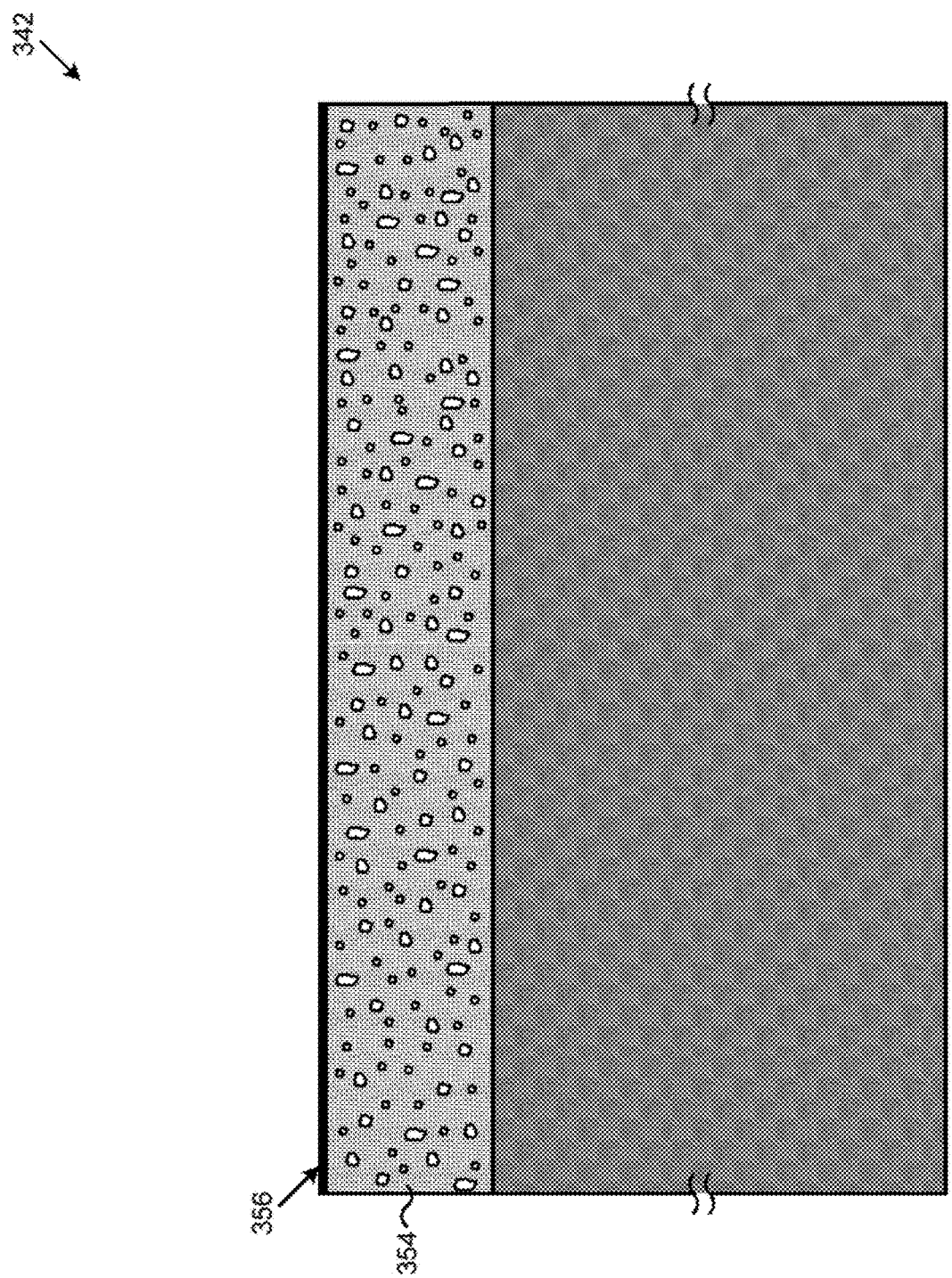

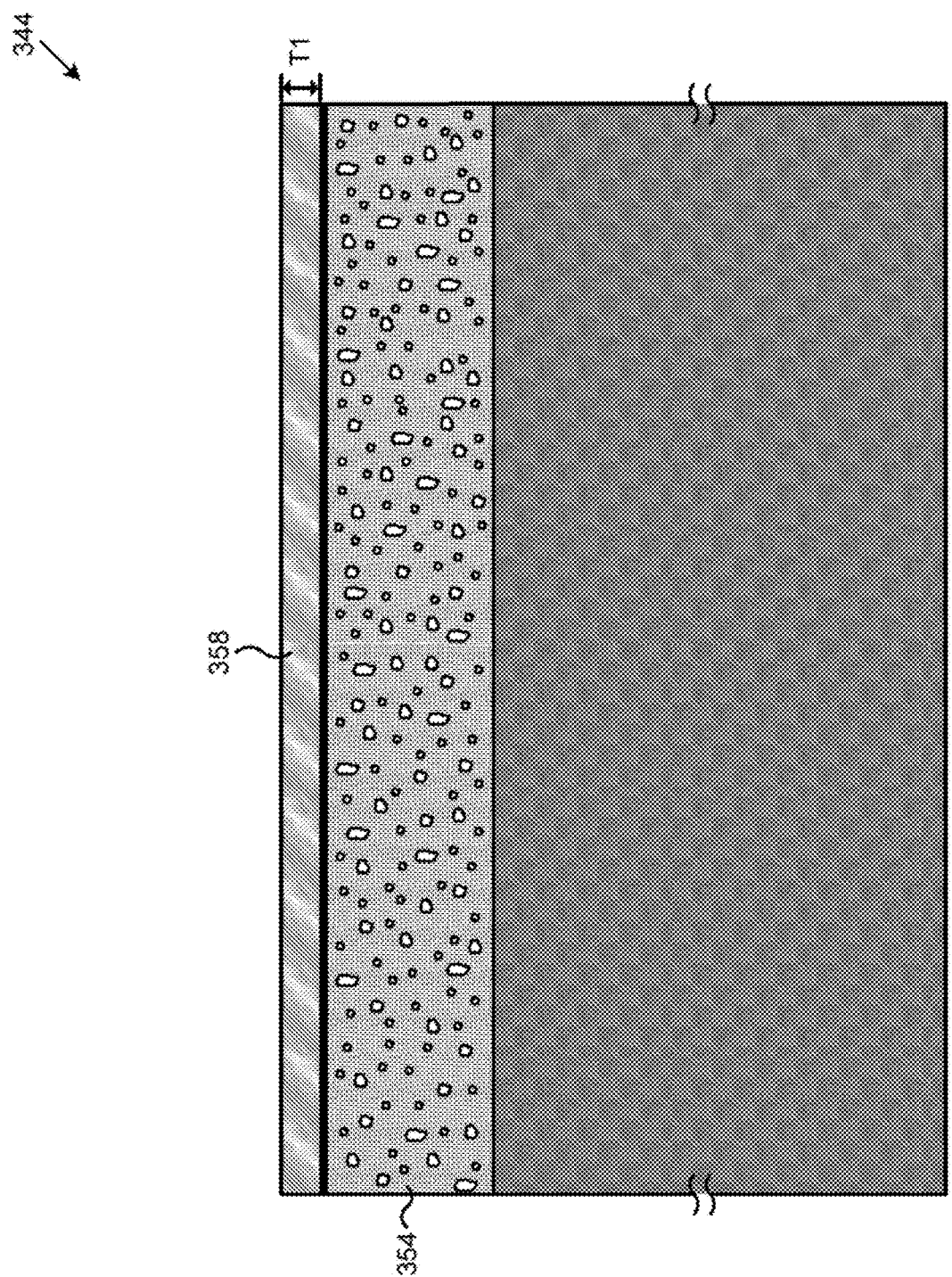

US 11,164,740 B2

SEMICONDUCTOR STRUCTURE HAVING POROUS SEMICONDUCTOR LAYER FOR RF DEVICES

BACKGROUND

Semiconductor-on-insulator (SOI) structures are commonly employed to realize radio frequency (RF) designs where low signal leakage is required. These SOI structures use a buried oxide (BOX) under a top device layer in which RF circuit components, such as transistors and/or passive components, are fabricated.

As known in the art, a handle wafer finctioning as a substrate under the BOX results in some signal leakage. In one approach, a high resistivity silicon is used for the handle wafer in order to improve isolation and reduce signal loss. However, the relatively high dielectric constant of silicon (k=11.7) results in significant capacitive loading of RF SOI devices. In another approach, a trap-rich layer is formed between the handle wafer and the BOX in order to minimize parasitic surface conduction effects that would adversely affect RF devices in the top device layer. However, this approach requires costly and/or specialized fabrication techniques.

Thus, there is need in the art for efficiently and effectively fabricating RF devices with reduced signal leakage at low cost while overcoming the disadvantages and deficiencies of the previously known approaches.

SUMMARY

The present disclosure is directed to a semiconductor structure having porous semiconductor layer for RF devices, substantially as shown in and/or described in connection with at least one of the figures, and as set forth in the claims.

BRIEF DESCRIPTION OF THE DRAWINGS

FIG. 3A illustrates a cross-sectional view of a portion of a semiconductor structure processed in accordance with action 240 in the flowchart of FIG. 2 according to one implementation of the present application.

FIG. 3B illustrates a cross-sectional view of a portion of a semiconductor structure processed in accordance with action 242 in the flowchart of FIG. 2 according to one implementation of the present application FIG. 3C illustrates a cross-sectional view of a portion of a semiconductor structure processed in accordance with action 244 in the flowchart of FIG. 2 according to one implementation of the present application

DETAILED DESCRIPTION

Figure 1:
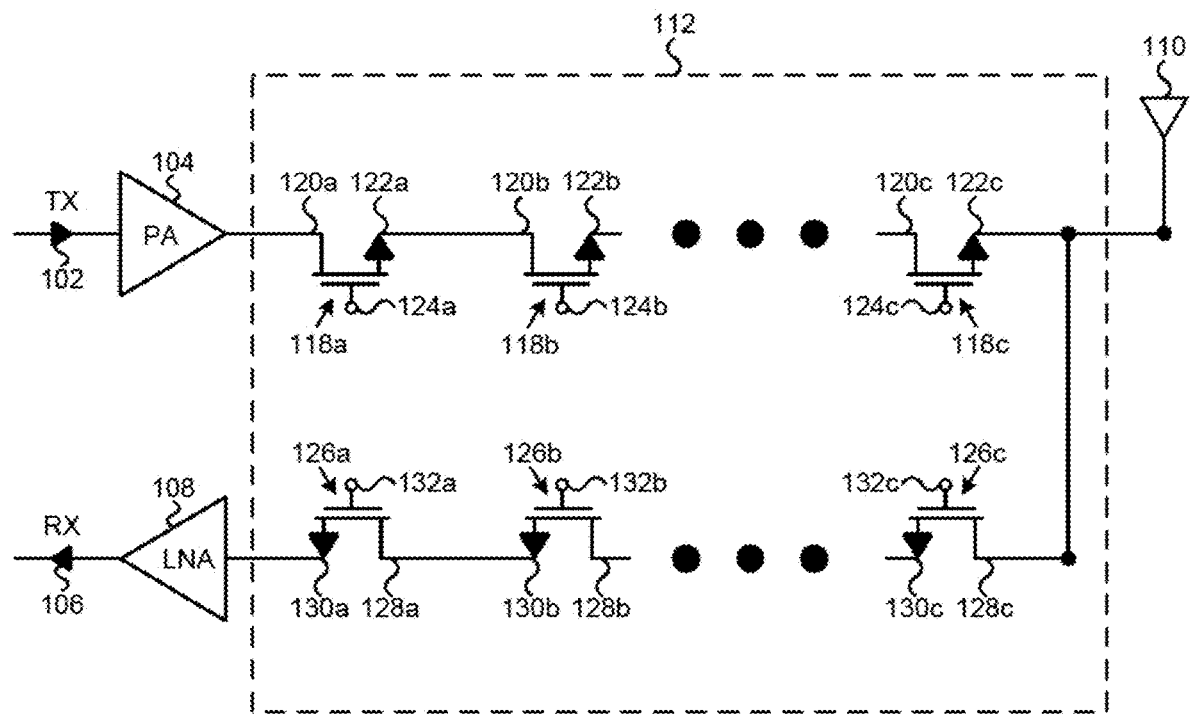
FIG. 1 illustrates a portion of a transceiver including a radio frequency (RF) switch employing stacked transistors according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a portion of a transceiver including a radio frequency (RF) switch employing stacked transistors according to one implementation of the present application. The transceiver in FIG. 1 includes transmit input 102, power amplifier (PA) 104, receive output 106, low-noise amplifier (LNA) 108, antenna 110, and radio frequency (RF) switch 112.

RF switch 112 is situated between PA 104 and antenna 110. PA 104 amplifies RF signals transmitted from transmit input 102. In one implementation, transmit input 102 can be coupled to a mixer (not shown in FIG. 1), or to another input source. The output of PA 104 is coupled to one end of RF switch 112. A matching network (not shown in FIG. 1) can be coupled between PA 104 and RF switch 112. Another end of RF switch 112 is coupled to antenna 110. Antenna 110 can transmit amplified RF signals. In one implementation, RF switch 112 can be coupled to an antenna array, rather than a single antenna 110.

RF switch 112 is also situated between LNA 108 and antenna 110. Antenna 110 also receives RF signals. Antenna 110 is coupled to one end of RF switch 112. Another end of RF switch 112 is coupled to the input of LNA 108. LNA 108 amplifies RF signals received from RF switch 112. A matching network (not shown in FIG. 1) can be coupled between RF switch 112 and LNA 108. Receive output 106 receives amplified RF signals from LNA 108. In one implementation, receive output 106 can be coupled to a mixer (not shown in FIG. 1), or to another output source.

RF switch 112 includes two stacks of transistors. The first stack includes transistors 118a, 118b, and 118c. Drain 120a of transistor 118a is coupled to the output of PA 104. Source 122a of transistor 118a is coupled to drain 120b of transistor 118b. Source 122b of transistor 118b can be coupled to the drain of additional transistors, and ultimately coupled to drain 120c of transistor 118c. Source 122c of transistor 118c is coupled to antenna 110. Gates 124a, 124b, and 124c of transistors 118a, 118b, and 118c respectively can be coupled to a controller or a pulse generator (not shown) for switching transistors 118a, 118b, and 118c between ON and OFF states.

The second stack includes transistors 126a, 126b, and 126c. Source 130a of transistor 126a is coupled to the input of LNA 108. Drain 128a of transistor 126a is coupled to source 130b of transistor 126b. Drain 128b of transistor 126b can be coupled to the drain of additional transistors, and ultimately coupled to drain source 130c of transistor 126c. Drain 128c of transistor 126c is coupled to antenna 110. Gates 132a, 132b, and 132c of transistors 126a, 126b, and 126c respectively can be coupled to a controller or a pulse generator (not shown) for switching transistors 126a, 126b, and 126c between ON and OFF states.

In the example of FIG. 1, RF switch 112 switches the transceiver in FIG. 1 between receive and transmit modes. When transistors 118a, 118b, and 118c are in OFF states, and transistors 126a, 126b, and 126c are in ON states, the transceiver is in receive mode. Transistors 126a, 126b, and 126c serve as a receive path for RF signals received by antenna 110 to pass to LNA 108 and to receive output 106. When transistors 118a, 118b, and 118c are in ON states, and transistors 126a, 126b, and 126c are in OFF states, the transceiver is in transmit mode. Transistors 118a, 118b, and 118c serve as a transmit path for RF signals transmitted from transmit input 102 and PA 104 to pass to antenna 110. In various implementations, RF switch 112 can include more stacks of transistors and/or more amplifiers. In various implementations, RF switch 112 can switch the transceiver between two transmit modes corresponding to different frequencies, or between two receive modes corresponding to different frequencies.

In the present implementation, transistors 118a, 118b, 118c, 126a, 126b, and 126c are N-type field effect transistors (NFETs). In various implementations, transistors 118a, 118b, 118c, 126a, 126b, and 126c can be P-type FETs (PFETs), junction FETs (JFETs), or any other type of transistor. By stacking transistors 118a, 118b, 118c, 126a, 126b, and 126c as shown in FIG. 1, the overall OFF state power and voltage handling capability for RF switch 112 can be increased. For example, if only transistors 118a and 126a were used, RF switch 112 may have an OFF state voltage handling capability of five volts (5 V). If eight transistors were used in each stack, RF switch 112 may have an OFF state voltage handling capability of forty volts (40 V). In various implementations. RF switch 112 can have more or fewer stacked transistors than shown in FIG. 1.

As described below, in conventional semiconductor structures, signals can leak from RF switch 112, for example, to ground or to other devices. This signal leakage is particularly problematic when transistors 118a, 118b, 118c, 126a, 126b, and 126c are in OFF states, and when dealing with higher frequency signals, such as RF signals. According to the present application, RF switch 112 can be utilized in a semiconductor structure that reduces signal leakage. It is noted that, although the present application focuses on RF signals, the signals may have frequencies other than RF frequencies.

Figure 2:
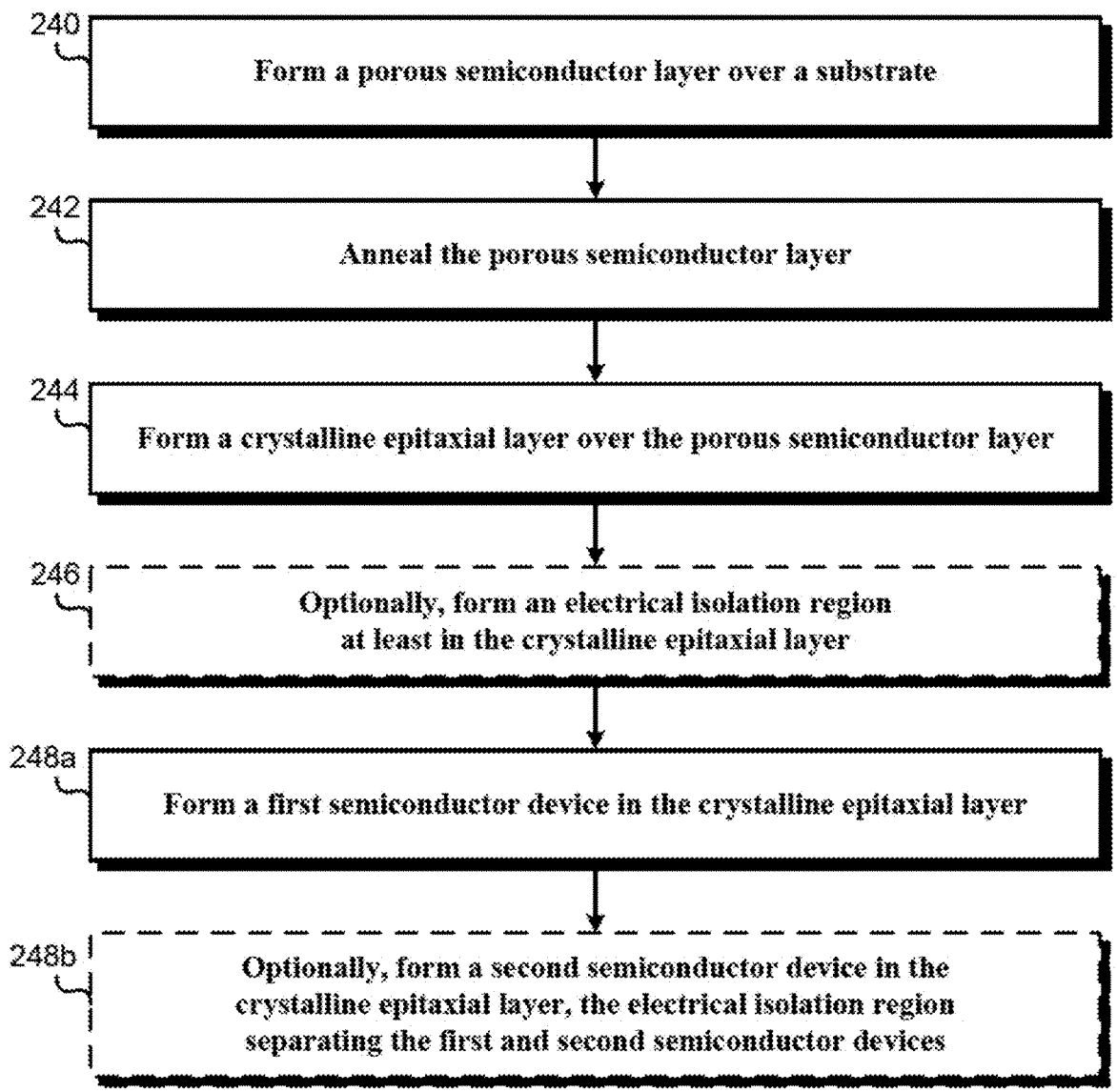
FIG. 2 illustrates a portion of a flowchart of an exemplary method for manufacturing a semiconductor structure according to one implementation of the present application.
Figure 3D:
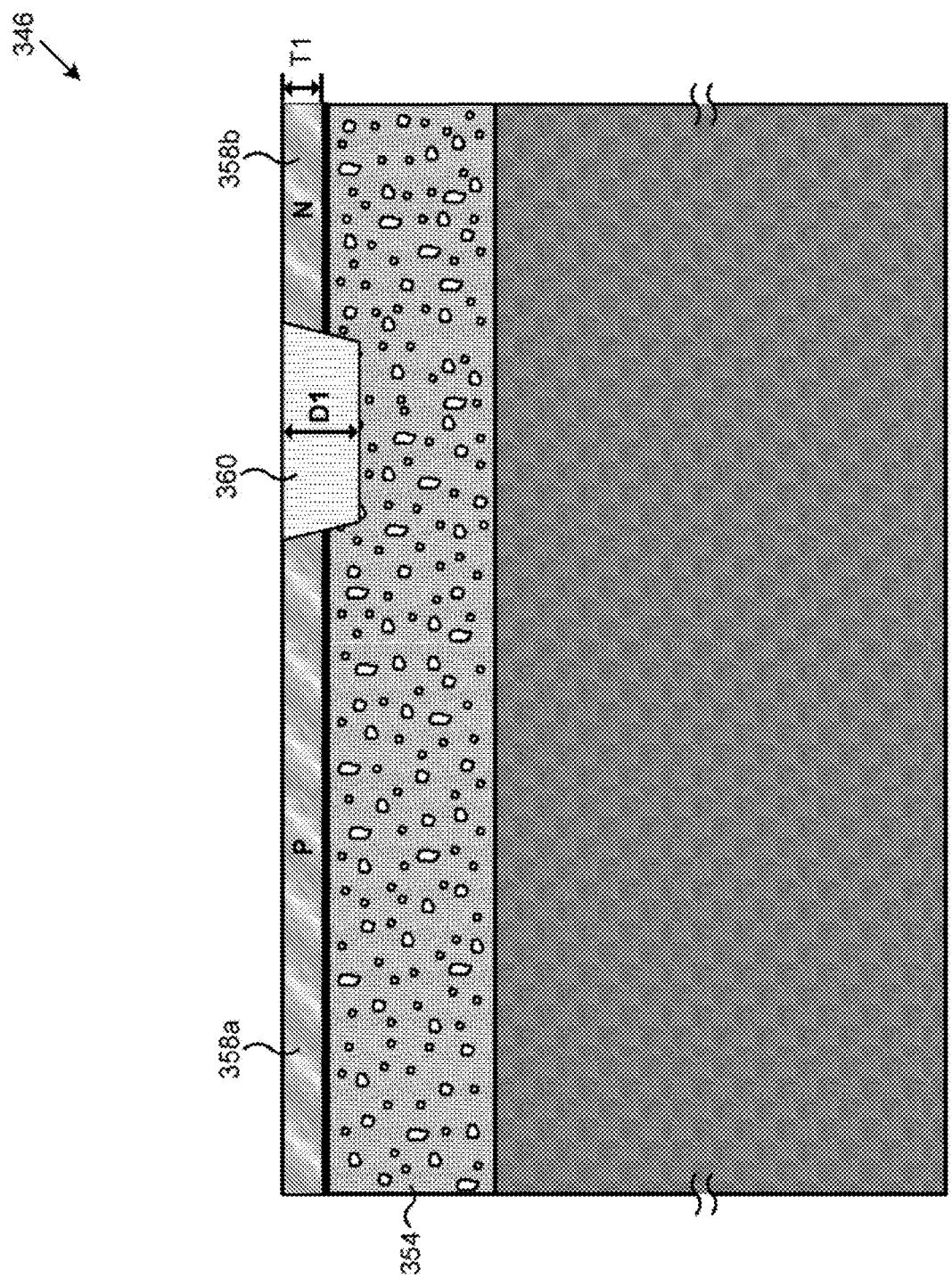
FIG. 3D illustrates a cross-sectional view of a portion of a semiconductor structure processed in accordance with action 246 in the flowchart of FIG. 2 according to one implementation of the present application.

FIG. 2 illustrates a portion of a flowchart of an exemplary method for manufacturing a semiconductor structure according to one implementation of the present application. Structures shown in FIGS. 3A through 3E illustrate the results of performing actions 240 through 248b shown in the flowchart of FIG. 2. For example, FIG. 3A shows a semiconductor structure after performing action 240 in FIG. 2, FIG. 3B shows a semiconductor structure after performing action 242 in FIG. 2, and so forth.

Actions 240 through 248b shown in the flowchart of FIG. 2 are sufficient to describe one implementation of the present inventive concepts. Other implementations of the present inventive concepts may utilize actions different from those shown in the flowchart of FIG. 2. Certain details and features have been left out of the flowchart of FIG. 2 that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 3A illustrates a cross-sectional view of a portion of a semiconductor structure processed in accordance with action 240 in the flowchart of FIG. 2 according to one implementation of the present application. As shown in FIG. 3A, according to action 240, semiconductor structure 340 including porous semiconductor layer 354 situated over substrate 352 is formed. In the present implementation, substrate 352 is a bulk silicon substrate. For example, substrate 352 can be a P-type bulk silicon substrate having a thickness of approximately seven hundred microns (700 µm). In various implementations, substrate 352 may be any other type of substrate.

Porous semiconductor layer 354 situated over substrate 352 is a semiconductor layer having voids, or pores, therein. Within porous semiconductor layer 354, the pores can have any orientation, branching, fill, or other morphological characteristic known in the art. Porous semiconductor layer 354 can be formed by using a top-down technique, where portions of substrate 352 are removed to generate pores. For example, porous semiconductor layer 354 can be formed by electrochemical etching using hydrofluoric acid (HF). Alternatively, porous semiconductor layer 354 can also be formed by stain etching, photoetching, or any other top-down technique known in the art. Porous semiconductor layer 354 can also be formed by using a bottom-up technique, where deposition results in a semiconductor layer having empty spaces. For example, porous semiconductor layer 354 can be formed by low-temperature high-density plasma (HDP) deposition. Alternatively, porous semiconductor layer 354 can also be formed by plasma hydrogenation of an amorphous layer, laser ablation, or any other bottom-up technique known in the art. In the present implementation, porous semiconductor layer 354 is a porous silicon layer, and has a thickness from approximately ten microns (10 µm) to approximately fifty microns (50 µm). In various implementations, porous semiconductor layer 354 may be any other type of porous semiconductor layer.

FIG. 3B illustrates a cross-sectional view of a portion of a semiconductor structure processed in accordance with action 242 in the flowchart of FIG. 2 according to one implementation of the present application. In semiconductor structure 342, porous semiconductor layer 354 is annealed. For example, porous semiconductor layer 354 can be annealed in argon (Ar) or hydrogen ($H_2$) at atmospheric pressure from a temperature of approximately seven hundred degrees Celsius (700° C.) to a temperature of approximately eleven hundred degrees Celsius (1100° C.) for approximately ten minutes (10 min). Any other annealing technique known in the art can be utilized, such as techniques utilizing different temperatures, durations, and/or pressures. The annealing shown in FIG. 3B reorganizes the pores in porous semiconductor layer 354 into larger cavities, while closing and smoothing surface 356 of porous semiconductor layer 354. The annealed porous semiconductor layer 354 serves as a template layer for growth of a crystalline epitaxial layer in a subsequent action.

FIG. 3C illustrates a cross-sectional view of a portion of a semiconductor structure processed in accordance with action 244 in the flowchart of FIG. 2 according to one implementation of the present application. In semiconductor structure 344, crystalline epitaxial layer 358 is formed over porous semiconductor layer 354. Crystalline epitaxial layer 358 is a thin layer of single-crystal material situated over porous semiconductor layer 354. In one implementation, crystalline epitaxial layer 358 is formed by chemical vapor deposition (CVD). In various implementations, crystalline epitaxial layer 358 can be formed by any other epitaxy technique known in the art. In the present implementation, crystalline epitaxial layer 358 is a silicon epitaxial layer, and has thickness T1 from approximately five hundred angstroms (500 Å) to approximately two thousand angstroms (2000 Å). In various implementations, crystalline epitaxial layer 358 may be any other type of crystalline epitaxial layer. In various implementations, more than one crystalline epitaxial layer 358 can be formed. Crystalline epitaxial layer 358 serves as device region for formation of semiconductor devices in subsequent actions.

FIG. 3D illustrates a cross-sectional view of a portion of a semiconductor structure processed in accordance with optional action 246 in the flowchart of FIG. 2 according to one implementation of the present application. In semiconductor structure 346 of FIG. 3D, electrical isolation region 360 is formed at least in crystalline epitaxial layer 358 (shown in FIG. 3C). In particular, in the example of FIG. 3D, electrical isolation region 360 extends through crystalline epitaxial layer 358 and into porous semiconductor layer 354.

Electrical isolation region 360 can be formed by etching through crystalline epitaxial layer 358 and into porous semiconductor layer 354, then depositing an electrically insulating material. In the present implementation, electrical isolation region 360 is also planarized with the top surface of crystalline epitaxial layer 358, for example, by using chemical machine polishing (CMP). Electrical isolation region 360 can comprise, for example, silicon dioxide ($SiO_2$).

In the present implementation, depth D1 of electrical isolation region 360 is greater than thickness T1 of crystalline epitaxial layer 358. Accordingly, electrical isolation region 360 separates crystalline epitaxial layer 358 of FIG. 3C into two crystalline epitaxial layers 358a and 358b. In one implementation, depth D1 of electrical isolation region 360 can be substantially equal to thickness T1. In another implementation, depth D1 of electrical isolation region 360 can be less than thickness T1, such that electrical isolation region 360 extends into crystalline epitaxial layer 358 but not into porous semiconductor layer 354. In various implementations, locally oxidized silicon (LOCOS) can be used instead of or in addition to electrical isolation region 360.

Crystalline epitaxial layers 358a and 358b can also be implanted with a dopant. For example, crystalline epitaxial layers 358a and 358b can be implanted with boron or other appropriate P-type dopant. In another example, one or both of crystalline epitaxial layers 358a and 358b can be implanted with phosphorus or other appropriate N-type dopant. One or more masks can be utilized to define portions of crystalline epitaxial layers 358a and 358b that will be implanted with dopants. In one implementation, crystalline epitaxial layers 358a and 358b are implanted with a dopant after forming electrical isolation region 360. In another implementation, crystalline epitaxial layer 358 in FIG. 3C can be implanted with dopants before forming electrical isolation region 360. In this implementation, electrical isolation region 360 can be formed in a uniform implant region, between two implant regions having different types or concentrations, and/or where two implant regions overlap.

As described below, electrical isolation region 360 reduces signal interference across crystalline epitaxial layers 358a and 358b. Electrical isolation region 360 is considered optional in that semiconductor structures according to the present application can be formed without electrical isolation region 360.

Figure 3E:
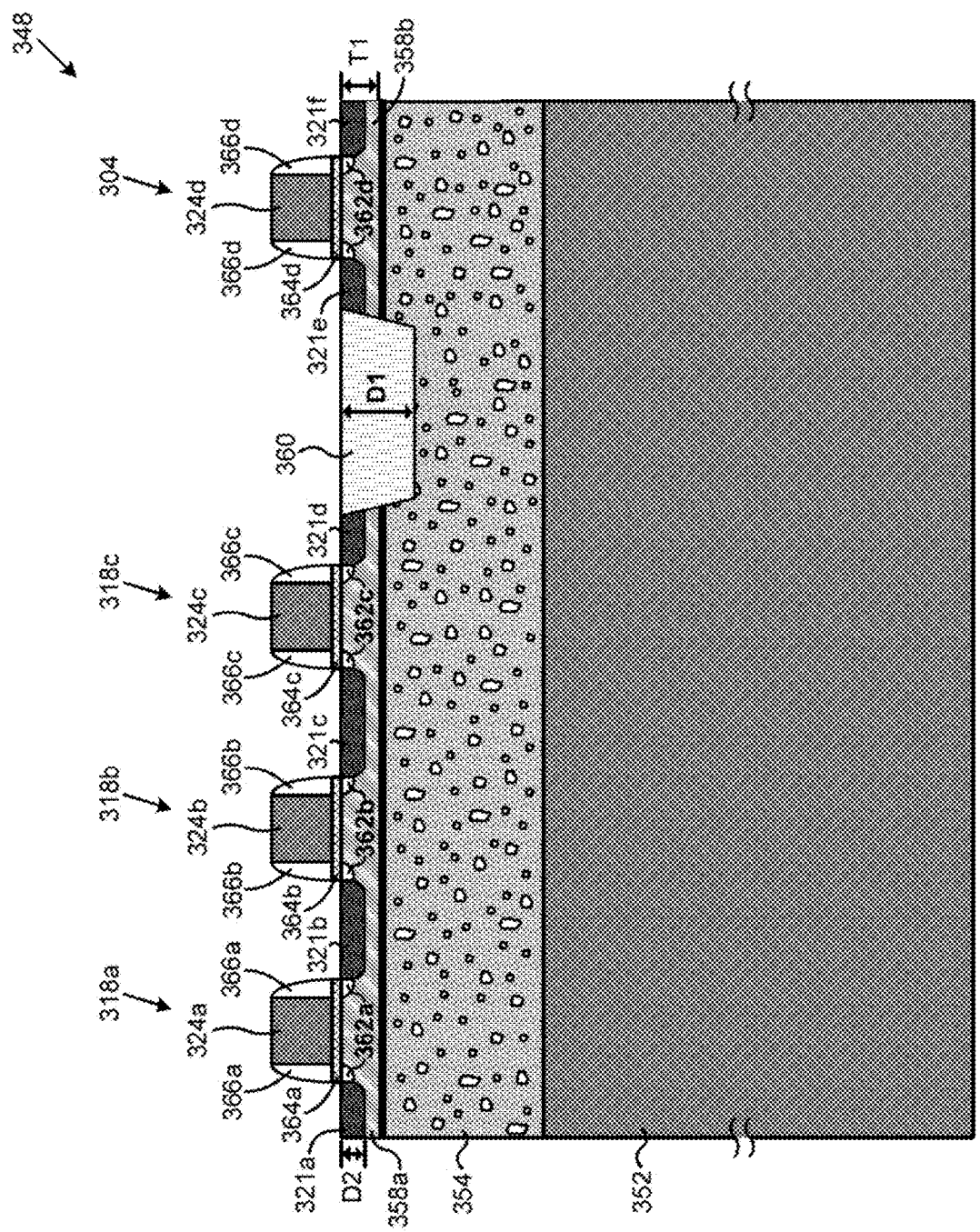
FIG. 3E illustrates a cross-sectional view of a portion of a semiconductor structure processed in accordance with actions 248a and 248b in the flowchart of FIG. 2 according to one implementation of the present application.

FIG. 3E illustrates a cross-sectional view of a portion of a semiconductor structure processed in accordance with actions 248a and 248b in the flowchart of FIG. 2 according to one implementation of the present application. In semiconductor structure 348 of FIG. 3E, semiconductor devices 318a, 318b, and 318c are formed in crystalline epitaxial layer 358a. Similarly, semiconductor device 304 is formed in crystalline epitaxial layer 358b. Electrical isolation region 360 separates semiconductor device 304 from semiconductor devices 318a, 318b, and 318c.

In the present implementation, semiconductor devices 318a, 318b, and 318c are transistors. Semiconductor devices 318a, 318b, and 318c in FIG. 3E may generally correspond to transistors 118a, 118b, and 118c (or transistors 126a, 126b, and 126c) utilized in RF switch 112 in FIG. 1. Semiconductor device 318a includes source/drain junctions 321a and 321b, gate 324a, lightly doped regions 362a, gate oxide 364a, and spacers 366a. Semiconductor device 318b includes source/drain junctions 321b and 321c, gate 324b, lightly doped regions 362b, gate oxide 364b, and spacers 366b. Semiconductor device 318c includes source/drain junctions 321c and 321d, gate 324c, lightly doped regions 362c, gate oxide 364c, and spacers 366c. Source/drain junction 321b is shared by semiconductor devices 318a and 318b; source/drain junction 321c is shared by semiconductor devices 318b and 318c.

In the present implementation, semiconductor device 304 is also a transistor. Semiconductor device 304 in FIG. 3E can be utilized in an amplifier, such as PA 104 (or LNA 108) in FIG. 1. Semiconductor device 304 includes source/drain junctions 321e and 321f, gate 324d, lightly doped regions 362d, gate oxide 364d, and spacers 366d.

In one implementation, semiconductor device 304 can be utilized as part of a logic circuit. Semiconductor device 304 is considered optional in that semiconductor structures according to the present application can be formed without semiconductor device 304.

Gates 324a, 324b, 324c, and 324d can comprise, for example, polycrystalline silicon (polySi). Source/drain junctions 321a, 321b, 321c, 321d, 321e, and 321f can be implanted with a dopant of a different type than their corresponding crystalline epitaxial layer 358a or 358b. Lightly doped regions 362a, 362b, 362c, and 362d can be implanted with a dopant of the same type as their adjacent source/drain junction, but having a lower concentration. Gate oxides 364a, 364b, 364c, and 364d can comprise, for example, silicon dioxide ($SiO_2$). Spacers 366a, 366b, 366c, and 366d can comprise, for example, silicon nitride (SiN).

In the present implementation, depth D2 of source/drain junctions 321a, 321b, 321c, 321d, 321e, and 321f is substantially less than thickness T1 of crystalline epitaxial layers 358a and 358b, such that source/drain junctions 321a, 321b, 321c, 321d, 321e, and 321f are not in contact with porous semiconductor layer 354. In one implementation, source/drain junctions 321a, 321b, 321c, and 321d are implanted with an N-type dopant (or a P-type dopant in some implementations) in one action, and source/drain junctions 321e and 321f are implanted with an N-type dopant (or a P-type dopant in some implementations) in another separate action. In one implementation, source/drain junctions 321a, 321b, 321c, 321d, 321e, and 321f are implanted with an N-type dopant (or a P-type dopant in some implementations) concurrently in a single action. In various implementations, silicide can be situated over source/drain junctions 321a, 321b, 321c, and 321d and/or gates 324a, 324b, and 324c. In various implementations, semiconductor structure 348 can include more or fewer semiconductor devices in crystalline epitaxial layer 358a. In various implementations, crystalline epitaxial layers 358a and 358b can include diodes, or types of semiconductor devices instead of or in addition to transistors.

Because semiconductor structure 348 includes porous semiconductor layer 354 (for example, a porous silicon layer), semiconductor structure 348 reduces signal leakage (for example, RF signal leakage) from semiconductor devices 318a, 318b, 318c, and 304 to ground. Further, porous semiconductor layer 354 (for example, a porous silicon layer) reduces signal interference (for example, RF signal interference) between the different devices built in crystalline epitaxial layers 358a and 358b. Pores in porous semiconductor layer 354 decrease its effective dielectric constant and increase its resistivity. In semiconductor structure 348 in FIG. 3E, porous semiconductor layer 354 has a dielectric constant substantially less than the dielectric constant of substrate 352. For example, when substrate 352 is a bulk silicon substrate having a dielectric constant of approximately 11.7, porous semiconductor layer 354 has a dielectric constant significantly less than 11.7. In particular, porous semiconductor layer 354 can have a dielectric constant from approximately 2.0 to approximately 4.0. The improved RF isolation that results from the low dielectric constant is especially advantageous for RF switching applications as it reduces signal distortion (i.e. improves linearity). It also results in a more uniform voltage distribution across the OFF state FET stack, increasing its power handling capability.

In semiconductor structure 348 in FIG. 3E, utilizing porous semiconductor layer 354, with its low dielectric constant, reduces parasitic capacitance between crystalline epitaxial layer 358a and substrate 352. Accordingly, RF signals are less likely to leak from semiconductor devices 318a, 318b, and 318c in crystalline epitaxial layer 358a to substrate 352. For example, in one implementation, semiconductor devices 318a, 318b, and 318c are transistors utilized to maintain RF switch 112 (shown in FIG. 1) in an OFF state, and substrate 352 functions as a ground. In their OFF states, transistors 318a, 318b, and 318c create a high resistance path along source/drain junctions 321a, 321b, 321c, and 321d, while the RF signals would have been subject to adverse impact of parasitic capacitances with substrate 352 if porous semiconductor layer 354 were not utilized. In other words, the RF signals could easily leak from semiconductor devices 318a, 318b, and 318c to ground, increasing OFF state parasitic capacitance and negatively impacting the performance of semiconductor structure 348. Where semiconductor devices 318a, 318b, and 318c are transistors utilized to maintain RF switch 112 (shown in FIG. 1) in an ON state, RF signal leakage, absent porous semiconductor layer 354, could also result in a higher insertion loss.

Because semiconductor structure 348 includes porous semiconductor layer 354 in combination with electrical isolation region 360, semiconductor structure 348 also reduces signal interference from semiconductor devices 318a, 318b, 318c to semiconductor device 304, and vice versa. If porous semiconductor layer 354 and electrical isolation region 360 were not utilized, signals (for example RF signals) from semiconductor device 304 could propagate through crystalline epitaxial layers 358b and 358a and/or substrate 352, and interfere with semiconductor devices 318a, 318b, 318c and generate additional undesirable noise in semiconductor devices 318a, 318b, 318c. Where semiconductor device 304 is a transistor utilized in PA 104 (shown in FIG. 1), these consequences could be amplified. Together, the low dielectric constant of porous semiconductor layer 354 and electrical insulation of electrical isolation region 360 reduce signal leakage and interference through crystalline epitaxial layers 358a and 358b and/or substrate 352. The leakage and interference are especially reduced where depth D1 of electrical isolation region 360 is equal to or greater than thickness T1 of crystalline epitaxial layers 358a and 358b.

Semiconductor structure 348 in FIG. 3E can achieve this reduced signal leakage without using costly materials for substrate 352, such as quartz or sapphire, and also without requiring costly and/or specialized fabrication techniques used to create trap-rich silicon-on-insulator (SOI) structures, such as smart cut techniques. As described above porous semiconductor layer 354 (for example, a porous silicon layer) can have a dielectric constant from approximately 2.0 to approximately 4.0, comparable to a buried oxide (BOX) in an SOI structure having a dielectric constant of approximately 3.7. Porous semiconductor layer 354 (for example, a porous silicon layer) can be situated over bulk semiconductor substrate 352 (for example, a bulk silicon substrate), and included in semiconductor structure 348 by various fabrication techniques. Thereafter, as discussed above, porous semiconductor layer 354 can be annealed and serve as a high-quality template for growth of crystalline epitaxial layer 358 (shown in FIG. 3C), in which semiconductor devices 318a, 318b, 318c, and 304 are formed. Further, shallow source/drain junctions 321a, 321b, 321c, and 321d improve performance of semiconductor devices 318a, 318b, and 318c by reducing junction capacitances.

Figure 3F:
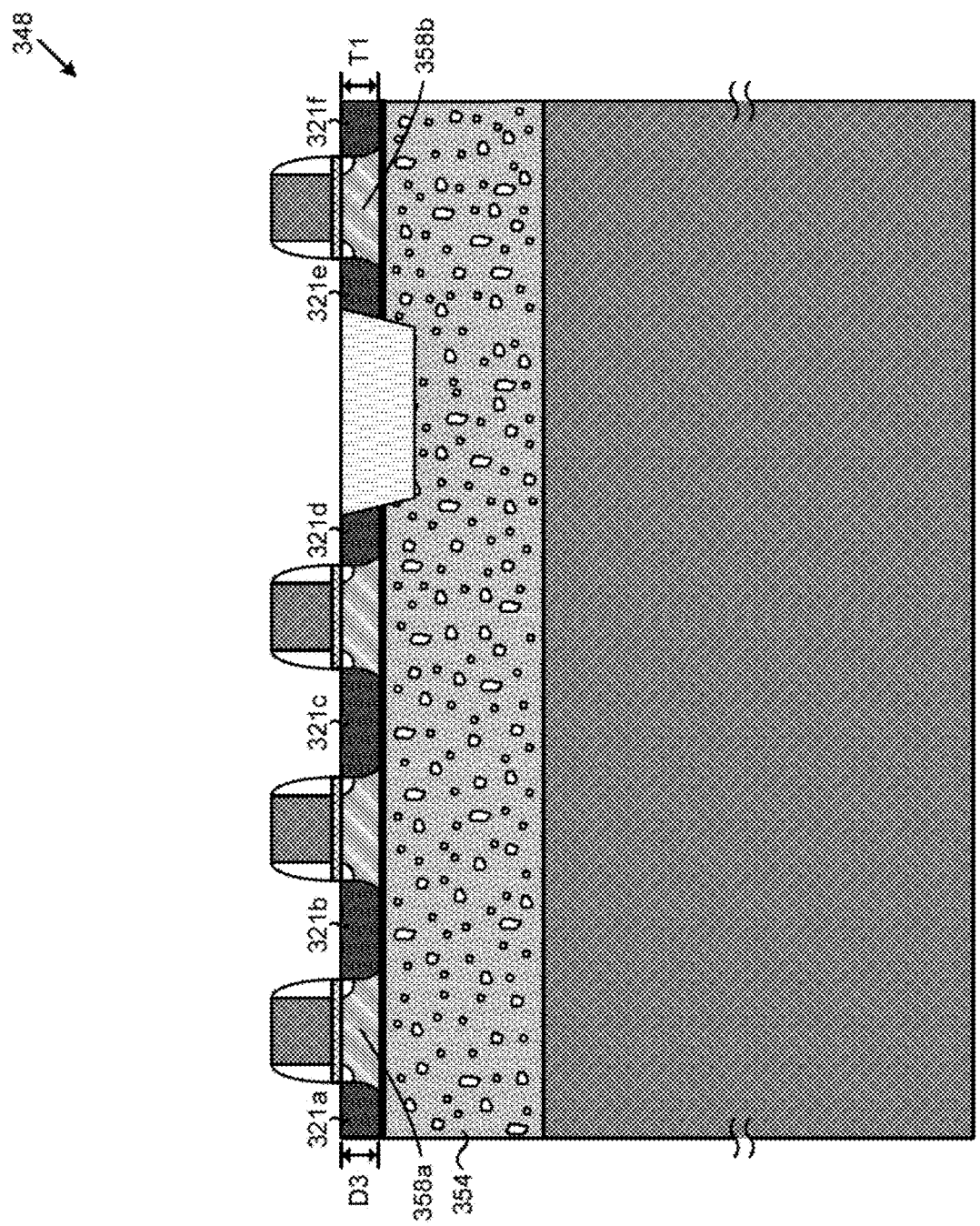
FIG. 3F illustrates a cross-sectional view of a portion of a semiconductor structure processed in accordance with actions 248a and 248b in the flowchart of FIG. 2 according to one implementation of the present application.

FIG. 3F illustrates a cross-sectional view of a portion of a semiconductor structure processed in accordance with actions 248a and 248b in the flowchart of FIG. 2 according to one implementation of the present application. Semiconductor structure 348 of FIG. 3F represents an alternative implementation to semiconductor structure 348 of FIG. 3E. Semiconductor structure 348 of FIG. 3F is similar to semiconductor structure 348 of FIG. 3E, except that, in semiconductor structure 348 of FIG. 3F, depth D3 of source/drain junctions 321a, 321b, 321c, 321d, 321e, and 321f is substantially equal to thickness T1 of crystalline epitaxial layers 358a and 358b, such that source/drain junctions 321a, 321b, 321c, 321d, 321e, and 321f are in contact with porous semiconductor layer 354. Compared to semiconductor structure 348 of FIG. 3E, deeper source/drain junctions 321e and 321f in semiconductor structure 348 of FIG. 3F improve performance of semiconductor device 304 by improving high current and high voltage handling. Other than the differences described above, semiconductor structure 348 of FIG. 3F may have any implementations and advantages described above with respect to semiconductor structure 348 of FIG. 3E.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:
1. A semiconductor structure comprising:
a substrate having a first dielectric constant;
a porous semiconductor layer situated over said substrate;

at least one crystalline epitaxial layer situated directly on said porous semiconductor layer;

a first semiconductor device situated in said at least one crystalline epitaxial layer;

said porous semiconductor layer having a second dielectric constant that is substantially less than said first dielectric constant such that said porous semiconductor layer reduces signal leakage from said first semiconductor device.

2. The semiconductor structure of claim 1, further comprising:

a second semiconductor device situated in said at least one crystalline epitaxial layer; and an electrical isolation region separating said first and second semiconductor devices.

3. The semiconductor structure of claim 2, wherein a depth of said electrical isolation region is equal to or greater than a thickness of said at least one crystalline epitaxial layer.

4. The semiconductor structure of claim 1, wherein said first semiconductor device is a transistor utilized in a radio frequency (RF) switch.

5. The semiconductor structure of claim 4, wherein a depth of a source/drain junction of said transistor is substantially less than a thickness of said at least one crystalline epitaxial layer, such that said source/drain junction is not in contact with said porous semiconductor layer.

6. The semiconductor structure of claim 4, wherein a depth of a source/drain junction of said transistor is substantially equal to a thickness of said at least one crystalline epitaxial layer, such that said source/drain junction is in contact with said porous semiconductor layer.

7. The semiconductor structure of claim 1, wherein said substrate comprises a first semiconductor material, and said porous semiconductor layer comprises a semiconductor material selected from one of said first semiconductor material and a second semiconductor material.

8. A semiconductor structure comprising:

a porous silicon layer;

at least one crystalline epitaxial layer situated directly on said porous silicon layer;

first and second transistors situated in said at least one crystalline epitaxial layer;

an electrical isolation region separating said first and second transistors.

9. The semiconductor structure of claim 8, wherein said porous silicon layer is situated over a bulk silicon substrate.

10. The semiconductor structure of claim 8, wherein a depth of said electrical isolation region is equal to or greater than a thickness of said at least one crystalline epitaxial layer.

11. The semiconductor structure of claim 8, wherein said first transistor is utilized in a radio frequency (RF) switch.

12. The semiconductor structure of claim 8, wherein a depth of a source/drain junction of said first transistor is substantially less than a thickness of said at least one crystalline epitaxial layer, such that said source/drain junction is not in contact with said porous silicon layer.

13. The semiconductor structure of claim 8, wherein a depth of a source/drain junction of said first transistor is substantially equal to a thickness of said at least one crystalline epitaxial layer, such that said source/drain junction is in contact with said porous silicon layer.

14. A semiconductor structure comprising:

a porous semiconductor layer situated over a substrate, said porous semiconductor layer having a higher resistivity than said substrate;

at least one crystalline epitaxial layer situated directly on said porous semiconductor layer;

a first semiconductor device situated in said at least one crystalline epitaxial layer.

15. The semiconductor structure of claim 14, wherein said substrate comprises a first semiconductor material, and said porous semiconductor layer comprises said first semiconductor material.

16. The semiconductor structure of claim 14, wherein said substrate comprises a first semiconductor material, and said porous semiconductor layer comprises a second semiconductor material.

17. The semiconductor structure of claim 14, further comprising:

a second semiconductor device situated in said at least one crystalline epitaxial layer; and an electrical isolation region separating said first and second semiconductor devices.

18. The semiconductor structure of claim 17, wherein a depth of said electrical isolation region is equal to or greater than a thickness of said at least one crystalline epitaxial layer.

19. The semiconductor structure of claim 14, wherein said first semiconductor device is a transistor utilized in a radio frequency (RF) switch.

20. The semiconductor structure of claim 19, wherein a depth of a source/drain junction of said transistor is substantially less than a thickness of said at least one crystalline epitaxial layer, such that said source/drain junction is not in contact with said porous semiconductor layer.

* * * * *